(12) United States Patent
Lee et al.

(10) Patent No.: US 7,613,054 B2
(45) Date of Patent: Nov. 3, 2009

(54) SRAM DEVICE WITH ENHANCED READ/WRITE OPERATIONS

(75) Inventors: Cheng-Hung Lee, Hsinchu (TW); Ping-Wei Wang, Hsin-Chu (TW); Ching-Wei Wu, Hsin Chu (TW); Shu-Hsuan Lin, Danshuei Township, Taipei County (TW); Feng-Ming Chang, Chia-yi (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 212 days.

(21) Appl. No.: 11/924,437

(22) Filed: Oct. 25, 2007

(65) Prior Publication Data

US 2009/0109768 A1   Apr. 30, 2009

(51) Int. Cl.
 *G11C 7/00* (2006.01)
(52) U.S. Cl. ......................... 365/190; 365/156
(58) Field of Classification Search ................ 365/190, 365/156
See application file for complete search history.

(56) References Cited

U.S. PATENT DOCUMENTS 5,831,897 A * 11/1998 Hodges ...................... 365/156

* cited by examiner

*Primary Examiner*—Son Dinh
*Assistant Examiner*—Nam Nguyen
(74) *Attorney, Agent, or Firm*—K&L Gates LLP

(57) ABSTRACT

An SRAM device includes: a first group of memory cells connected to a first local bit line and a first local complementary bit line for accessing data nodes thereof; a second group of memory cells connected to a second local bit line and a second local complementary bit line for accessing data nodes thereof; and a global bit line and a global complementary bit line connected to the first and second local bit lines for accessing data nodes of the first and second groups of memory cells, wherein the first local bit line, the first local complementary bit line, the second local bit line, the second local complementary bit line, the global bit line and the global complementary bit line are constructed on a same metallization level in the SRAM device.

20 Claims, 5 Drawing Sheets

SRAM DEVICE WITH ENHANCED READ/WRITE OPERATIONS

BACKGROUND

The present invention relates generally to integrated circuit designs, and more particularly to a static random access memory (SRAM) devices with enhanced read/write operations.

SRAM is a type of memory that is able to store data without constantly refreshing them as long as it is supplied with power. FIG. 1 schematically illustrates a circuit diagram 100 of a standard six-transistor SRAM cell with two cross-coupled inverters 102 and 104. The inverter 102 includes a pull-up transistor 114 and a pull-down transistor 116. The inverter 104 includes a pull-up transistor 118 and a pull-down transistor 120. A first storage node 106 of the inverter 102 is directly connected to the gates of both transistors of the inverter 104. A second storage node 108 of the inverter 104 is directly connected to the gates of both transistors of the inverter 102. The first storage node 106 of the inverter 102 is written to and read from through a pass gate transistor 110 that is coupled to a bit line BL. The second storage node 108 of the inverter 104 is written to and read from through a pass gate transistor 112 that is coupled to a complementary bit line BLB. The two pass gate transistors 110 and 112 are controlled by a common word line WL.

When the first storage node 106 is at a high voltage state and the pass gate transistors 110 and 112 are turned off, the pull-up transistor 118 is turned off and the pull-down transistor 120 is turned on, thereby pulling the voltage at the second storage node 108 to ground Vss. This low voltage state at the second storage node 108 turns on the pull-up transistor 114 and turns off the pull-down transistor 116, thereby sustaining the first storage node 106 with a high voltage from the voltage supply Vcc. During read operation, the word line WL is asserted to turn on the pass gate transistors 110 and 112, so that the logic states at the storage nodes 106 and 108 can be read by detecting the voltages on the bit line BL and the complementary bit line BLB. During write operation, the word line WL is asserted to turn on the pass gate transistors 110 and 112, and the bit line BL and the complementary bit line BLB are provided with programming voltages, so that the voltage states at the storage nodes 106 and 108 can be programmed.

FIG. 2 illustrates a layout view 200 of the M2 metallization level of the SRAM cell 100 shown in FIG. 1. A power line Vcc is disposed between a bit line BL and a complementary bit line BLB. The power line Vcc, bit line BL, and complementary bit line BLB are connected to higher level interconnections of the SRAM cell though various via contacts 202 and landing pads 204. The bit line BL and the complementary bit line BLB are locally constructed to connect a column of memory cells, and need to be connected to a global bit line GBL and a global complementary global bit line GBLB (not shown in the figure) on a higher level, such as the M4 metallization level, such that the cells can be accessed from outside of a memory chip.

One drawback of the conventional SRAM device is that the discharge of the bit line BL and the complementary bit line BLB through the global bit line GBL and the global complementary bit line GBLB may be delayed due the RC effect induced by the distant interconnection routes between the M2 and M4 metallization levels. As a result, the performance of the conventional SRAM device is less than ideal, which provides room for further performance improvement.

SUMMARY

The present invention is related to an SRAM device with enhanced read/write operations. In one embodiment of the present invention, the SRAM device includes: a first group of memory cells connected to a first local bit line and a first local complementary bit line for accessing data nodes thereof; a second group of memory cells connected to a second local bit line and a second local complementary bit line for accessing data nodes thereof; and a global bit line and a global complementary bit line connected to the first and second local bit lines for accessing data nodes of the first and second groups of memory cells, wherein the first local bit line, the first local complementary bit line, the second local bit line, the second local complementary bit line, the global bit line and the global complementary bit line are constructed on a same metallization level in the SRAM device.

The construction and method of operation of the invention, however, together with additional objectives and advantages thereof will be best understood from the following description of specific embodiments when read in connection with the accompanying drawings.

DESCRIPTION

This invention describes an SRAM device with enhanced read/write operation. The following merely illustrates various embodiments of the present invention for purposes of explaining the principles thereof. It is understood that those skilled in the art will be able to devise various equivalents that, although not explicitly described herein, embody the principles of this invention.

Figure 3:
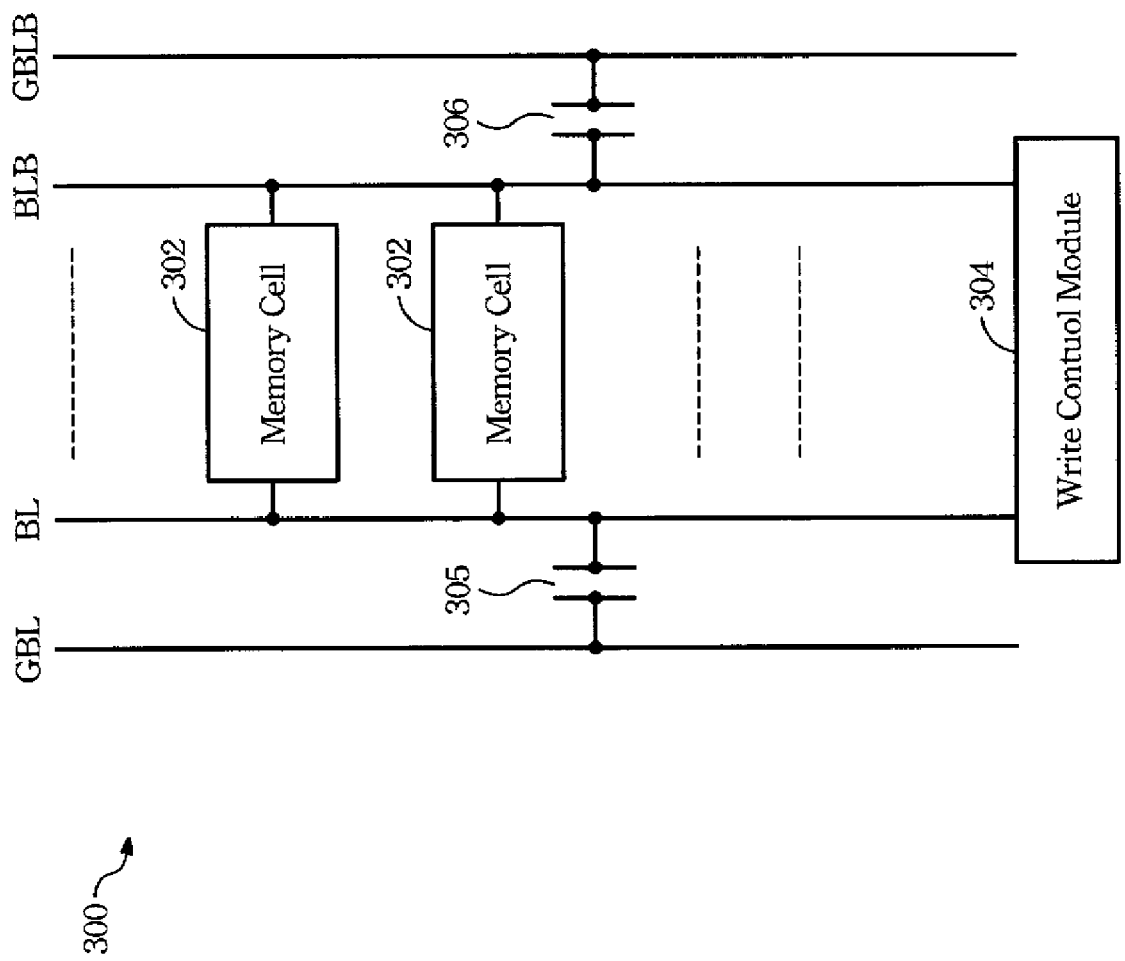
FIG. 3 illustrates a block diagram of a memory array of a SRAM device in accordance with one embodiment of the present invention.

FIG. 3 illustrates a block diagram of a memory array 300 of a SRAM device in accordance with one embodiment of the present invention. The memory array 300 includes one or more memory cells 302 arranged in a column. The memory cells 302 are coupled between a local bit line BL and a local complementary bit line BLB through which the memory cells 302 can be accessed for read/write operation. A write control module 304 is connected to the local bit line BL and the local complementary bit line BLB for writing data to the memory cells 302.

A global bit line GBL and a global complementary bit line GBLB are placed adjacent to the local bit line BL and the local complementary bit line BLB, respectively. The global bit line GBL and the global complementary bit line GBLB differ from the local bit line BL and complementary bit line BLB in the sense that the global lines connect more than one memory arrays whereas the local lines connect only the memory cells within a particular memory array. Due to the proximity of the global lines and the local lines, capacitors 305 and 306 are formed between the global bit line GBL and the local bit line BL and between the global complementary bit line GBLB and the local complementary bit line BLB, respectively. The capacitors 305 and 306 facilitate the discharge of the global lines during read operation, and push the voltages on the local lines during write operation, thereby improving the performance of the SRAM device.

Figure 1:
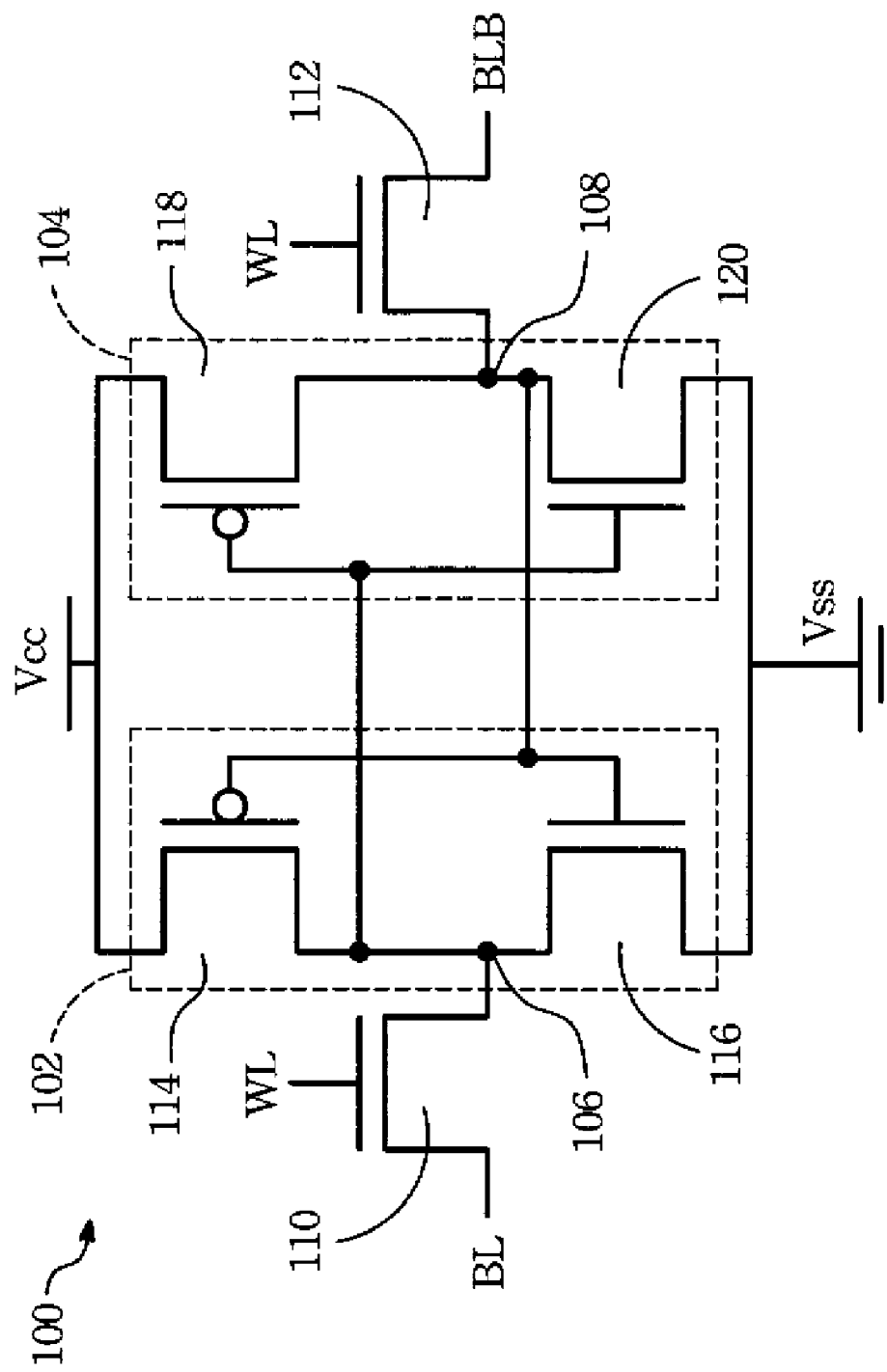
FIG. 1 schematically illustrates a typical six-transistor SRAM cell.
Figure 2:
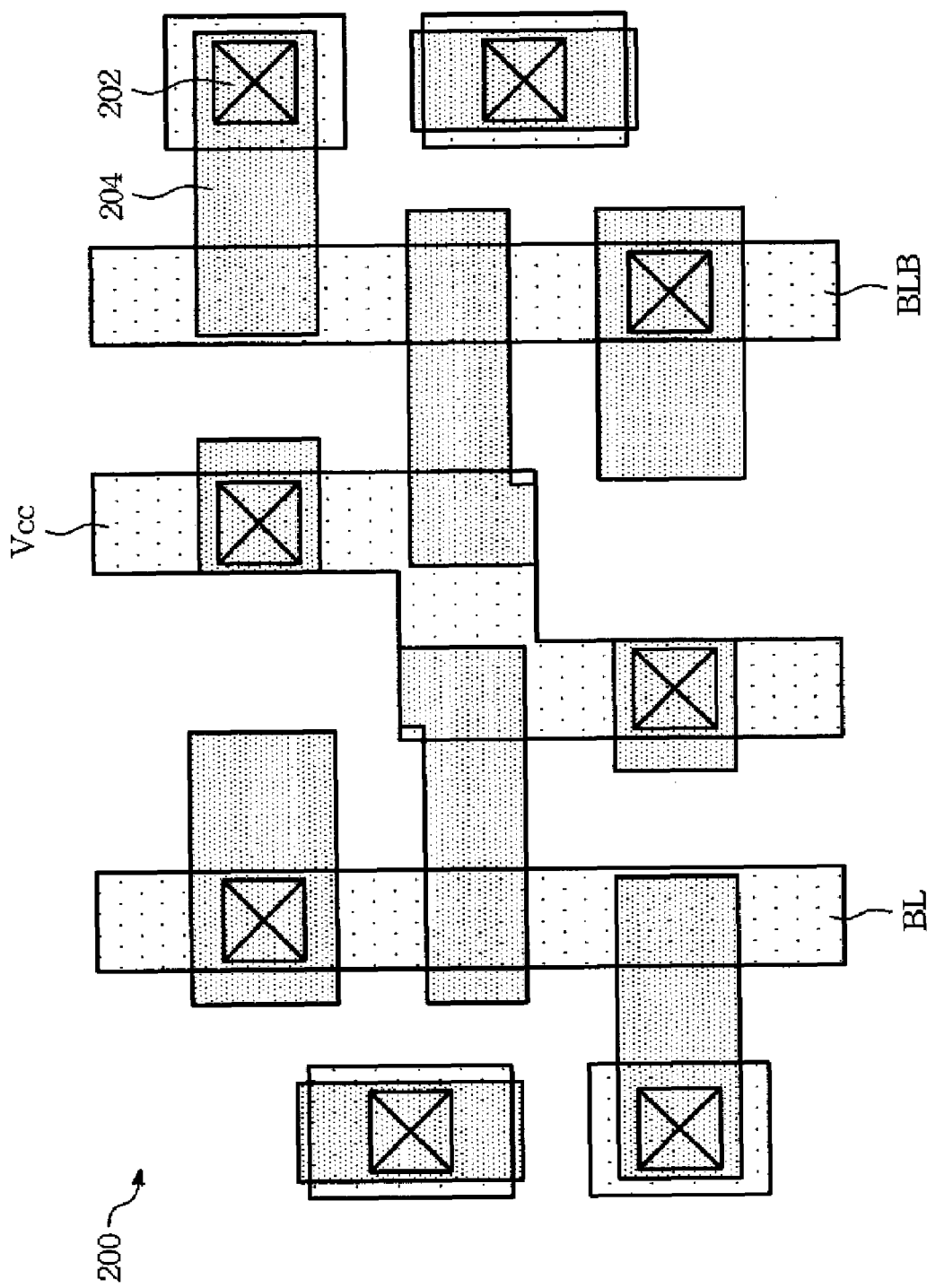
FIG. 2 illustrates a layout view of the M2 level of the conventional SRAM cell.
Figure 4:
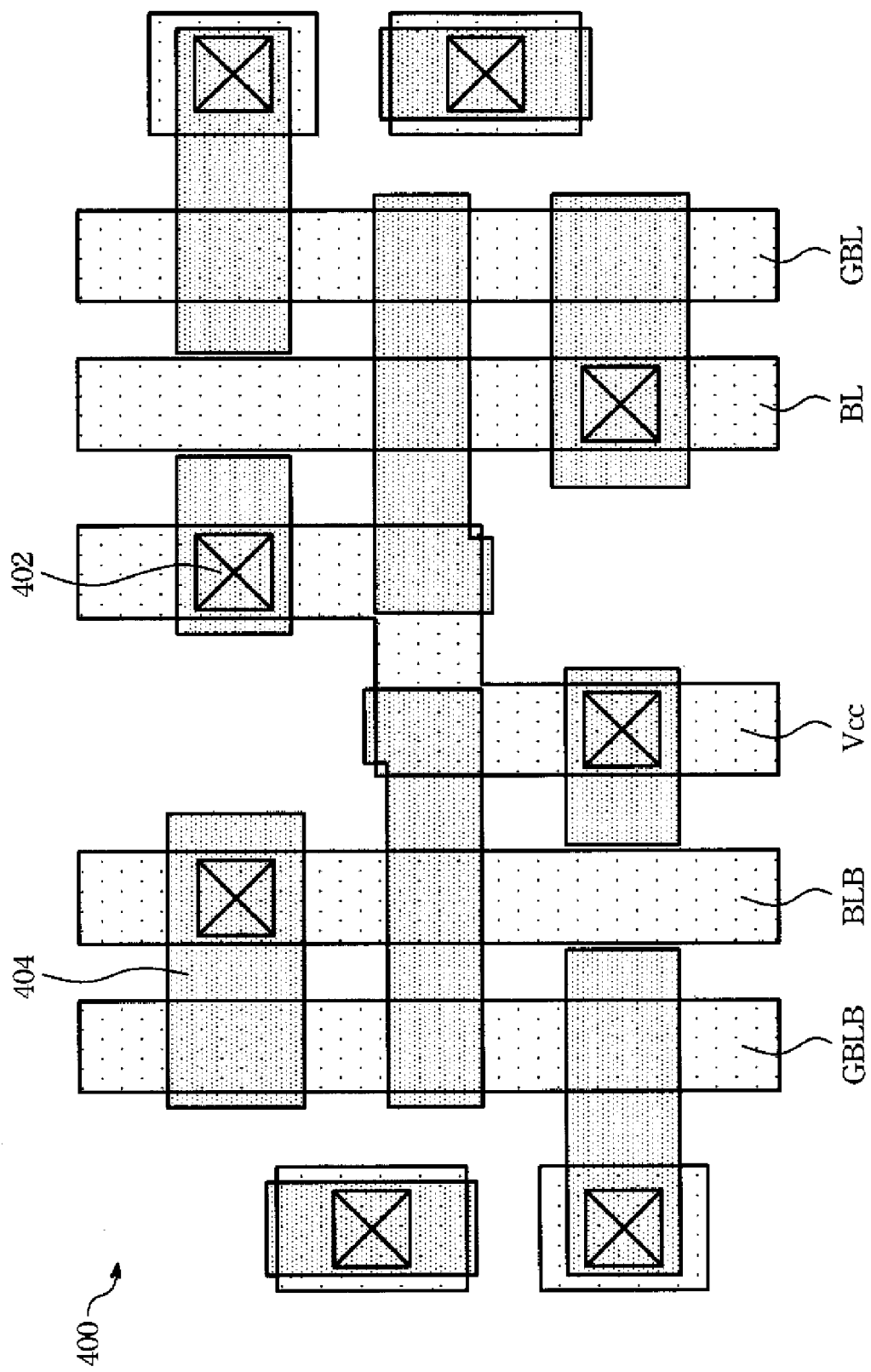
FIG. 4 illustrates a layout view of the M2 metallization level of an SRAM cell in accordance with one embodiment of the present invention.

FIG. 4 illustrates a layout view 400 of the M2 metallization level of the typical SRAM cell, for example, as shown in FIG. 1 in accordance with one embodiment of the present invention. A power line Vcc is disposed between a local bit line BL and a local complementary bit line BLB. The power line Vcc, local bit line BL and local complementary bit line BLB are connected to higher level interconnections of the SRAM cell though various via contacts 402 and landing pads 404. A global bit line GBL and a global complementary bit line GBLB are placed adjacent to the local bit line BL and the local complementary bit line BLB, respectively. It is noted that although the local lines and the global lines are constructed on the M2 metallization level, they can be constructed on other metallization layers, such as the M3 or M4 levels.

Figure 5:
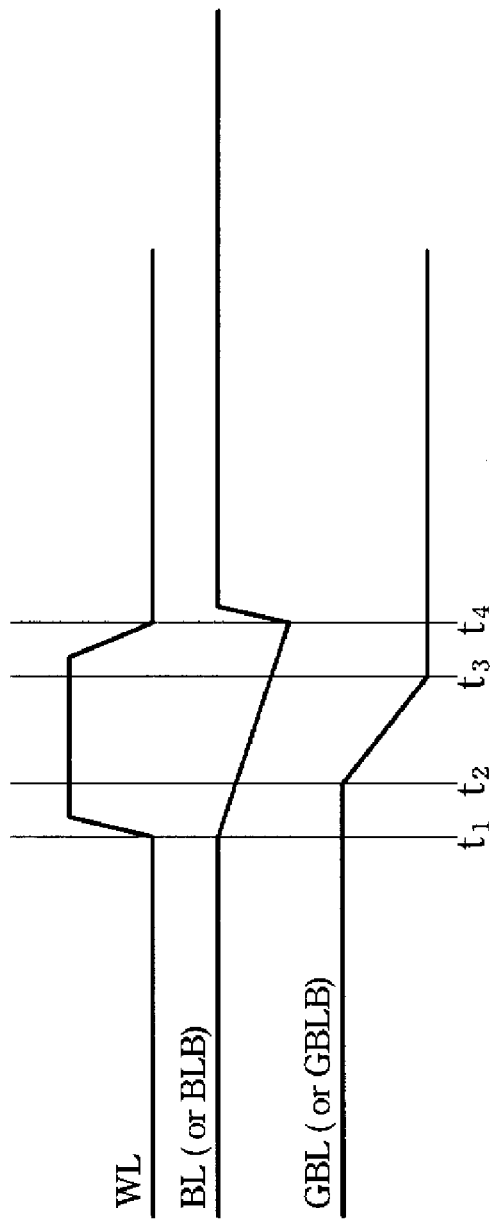
FIG. 5 illustrates a timing diagram showing read operation of the SRAM cell in accordance with one embodiment of the present invention.

The proximity between the global lines and the local lines provides coupling capacitance that improves the performance of the SRAM device. Referring simultaneously to FIGS. 1 and 5, a timing diagram showing read operation of the SRAM cell is illustrated in accordance with one embodiment of the present invention. During read operation, the voltage on a word line is raised to a high level to turn on the pass gate transistors 110 and 112 at time t1. As the word line voltage ramps up, the voltage on the local bit line BL or the local complementary bit line BLB starts to go down due to the discharge of the electrons retained at the storages nodes 106 and 108 of the SRAM memory cell 100. The voltage drop on the local bit line BL or local complementary bit line BLB drives down the voltage on the global bit line GBL or the global complementary bit line GBLB due to the coupling capacitance there between. This coupling effect accelerates the discharge on the global lines, in addition to their normal discharge rates for electrons traveling from the local lines to the global lines through the interconnections. As shown in FIG. 5, the discharge of the global lines, starting at time t2, lags behind of the discharges of the local lines, but has a faster discharge rate than that of the local lines. As a result, the discharge of the global lines would complete at time t3 before the local lines do at time t4 when the voltage on the word line drops to the low level. Thus, the discharge speed of the global lines can be increased.

Figure 6:
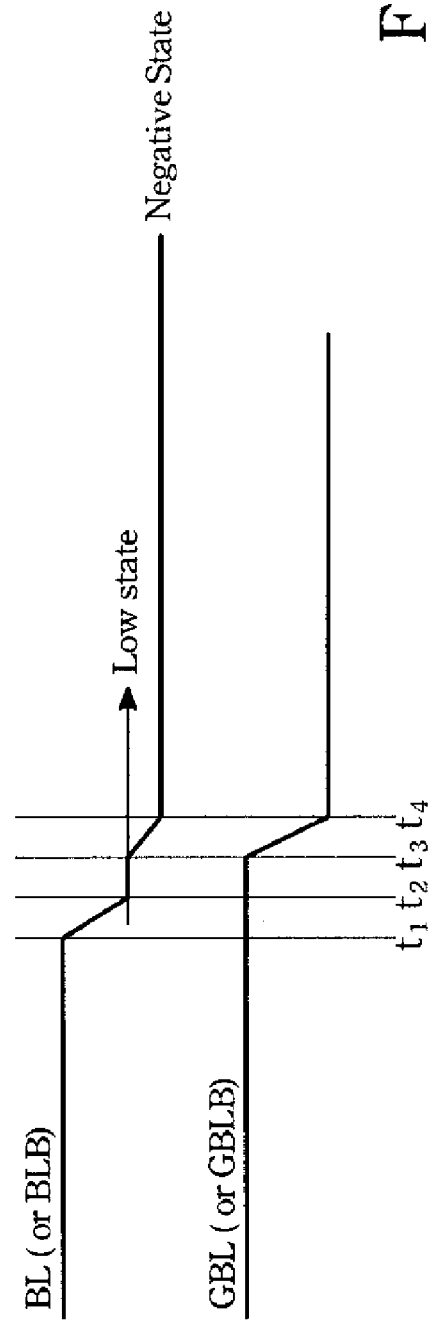
FIG. 6 illustrates a timing diagram showing write operation of the SRAM cell in accordance with one embodiment of the present invention.

Referring simultaneously to FIGS. 1 and 6, a timing diagram showing write operation of the SRAM cell 100 is illustrated in accordance with one embodiment of the present invention. During write operation, the voltage on the local bit line BL or the local complementary bit line BLB drops at time t1 to a low state at time t2. The global bit line GBL or global complementary GBLB is controlled to have its voltage drop at time t3. Due to the coupling capacitance between the global lines and the local lines, the voltage drop on the global lines drives the voltage on the local line beyond its original low state to a negative state. In this embodiment of the present invention, the low sate for the local lines is approximately between 0 and 100 mv, whereas the negative state ranges approximately from −10 to −300 mv. As a result, the negative state helps the SRAM cell 100 be programmed unambiguously, thereby reducing the error rate of programming.

It is noted that the timing of the discharge of the local lines or the global lines can be controlled by a logic module comprised of various logic gates, such as inverters, AND gates, NAND gates, OR gates and NOR gates. Due to the coupling capacitance between the local lines and global lines, the signals on the global and local lines would have the same phase, i.e. the same direction of voltage swing.

As discussed above, the embodiments of the invention have the advantages of a faster discharge speed during the read operation, and a higher data accuracy of programming during the write operation. Thus, the performance of the SARM device can be improved. In addition to placing the global lines and the local lines on the same metallization layer, such as the M2 metallization level, higher metallization levels can become less crowded, and therefore their porosity can be improved.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) device comprising:
   a first group of memory cells connected to a first local bit line and a first local complementary bit line for accessing data nodes thereof;
   a second group of memory cells connected to a second local bit line and a second local complementary bit line for accessing data nodes thereof; and
   a global bit line and a global complementary bit line connected to the first and second local bit lines for accessing data nodes of the first and second groups of memory cells,
   wherein the first local bit line, the first local complementary bit line, the second local bit line, the second local complementary bit line, the global bit line and the global complementary bit line are constructed on a same metallization level in the SRAM device.

2. The SRAM device of claim 1 wherein the metallization level is M2 level.

3. The SRAM device of claim 1 wherein the global bit line is placed adjacent to the first local bit line for providing a capacitance there between.

4. The SRAM device of claim 3 wherein the global complementary bit line is placed adjacent to the first local complementary bit line for providing a capacitance there between.

5. The SRAM device of claim 4 comprising a local power line placed between the first local bit line and the first local complementary bit line.

6. The SRAM device of claim 1 wherein a signal on the global bit line or the global complementary bit line drops after a signal on the first local bit line or the first local complementary bit line reaches a low state during write operation.

7. The SRAM device of claim 6 wherein the low state is at a voltage level between 0 and 100 mv.

8. The SRAM device of claim 6 wherein the signal on the first local bit line or the first local complementary has a negative voltage when the signal on the global bit line or the global complementary bit line drops.

9. The SRAM device of claim 8 wherein the negative voltage is approximately between −10 and −300 mv.

10. The SRAM device of claim 1 wherein a signal on the first local bit line or the first local complementary bit line has a same phase as that of a signal on the global bit line or the global complementary bit line.

11. The SRAM device of claim 10 wherein the signal on the global bit line or the global complementary bit line has a leading edge lagging behind that of the signal on the first local bit line or the first local complementary bit line.

12. The SRAM device of claim 11 wherein the leading edge of the signal on the global bit line or the global complementary bit line is steeper than that of the signal on the first local bit line or the first local complementary bit line.

13. A semiconductor structure comprising:
  a first group of memory cells connected to a first local bit line and a first local complementary bit line for accessing data nodes thereof;
  a second group of memory cells connected to a second local bit line and a second local complementary bit line for accessing data nodes thereof; and
  a global bit line and a global complementary bit line connected to the first and second local bit lines for accessing data nodes of the first and second groups of memory cells,
  wherein the first local bit line, the first local complementary bit line, the second local bit line, the second local complementary bit line, the global bit line and the global complementary bit line are constructed on a same metallization level in the semiconductor structure, with the global bit line placed adjacent to the first local bit lines, the global complementary bit line placed adjacent to the first local complementary bit lines.

14. The semiconductor structure of claim 13 wherein a signal on the global bit line or the global complementary bit line drops after a signal on the first local bit line or the first local complementary bit line reaches a low state during write operation.

15. The semiconductor structure of claim 14 wherein the low state is at a voltage level between 0 and 100 mv.

16. The semiconductor structure of claim 15 wherein the signal on the first local bit line or the first local complementary has a negative voltage when the signal on the global bit line or the global complementary bit line drops.

17. The semiconductor structure of claim 16 wherein the negative voltage is approximately between −10 and −300 mv.

18. The semiconductor structure of claim 13 wherein a signal on the first local bit line or the first local complementary bit line has a same phase as that of a signal on the global bit line or the global complementary bit line.

19. The semiconductor structure of claim 18 wherein the signal on the global bit line or the global complementary bit line has a leading edge lagging behind that of the signal on the first local bit line or the first local complementary bit line.

20. The semiconductor structure of claim 19 wherein the leading edge of the signal on the global bit line or the global complementary bit line is steeper than that of the signal on the first local bit line or the first local complementary bit line.

* * * * *